(12) United States Patent
Kim et al.

(10) Patent No.: US 6,653,238 B2
(45) Date of Patent: Nov. 25, 2003

(54) METHOD FOR FORMING SEMICONDUCTOR DEVICE HAVING HIGH-DENSITY CONTACTS

(75) Inventors: Sung-Bong Kim, Kyunggi-do (KR); Jung-In Hong, Kyunggi-do (KR); Do-Hyung Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 8 days.

(21) Appl. No.: 10/062,775

(22) Filed: Jan. 30, 2002

(65) Prior Publication Data

US 2002/0106901 A1 Aug. 8, 2002

(30) Foreign Application Priority Data

Feb. 7, 2001 (KR) ............................. 2001-5975

(51) Int. Cl.[7] ............................. H01L 21/311
(52) U.S. Cl. ................... 438/700; 438/702; 438/717
(58) Field of Search ................. 438/618, 624, 438/625, 694, 700, 702, 706, 710, 714, 717

(56) References Cited

U.S. PATENT DOCUMENTS 4,656,732 A * 4/1987 Teng et al. ................. 438/639
5,461,004 A * 10/1995 Kim ............................. 438/671
6,004,839 A * 12/1999 Hayashi et al. .............. 438/210
6,261,960 B1 * 7/2001 Yu et al. ...................... 438/692
6,448,651 B1 * 9/2002 Kim ............................. 257/758

* cited by examiner

*Primary Examiner*—Kin-Chan Chen
(74) *Attorney, Agent, or Firm*—Marger Johnson & McCollom, P.C.

(57) ABSTRACT

Methods of forming high-density contacts are provided. An interlayer insulating layer and an auxiliary layer having interconnection line patterns are sequentially formed on a substrate in which a conductive region is formed. Next, a contact photoresist pattern having a bar-shaped pattern is formed on the auxiliary layer. The bar-shaped pattern is substantially orthogonal to the interconnection line pattern formed in the auxiliary layer. Then, the interlayer insulating layer is etched at a contact region using the contact photoresist pattern and the auxiliary layer having the interconnection line pattern therein as an etching mask. Subsequently, the interlayer insulating layer is etched using the auxiliary layer having the interconnection line pattern as an etching mask to form a contact hole that extends through the interlayer insulating layer to the conductive region and to form an interconnection groove in an upper portion of the interlayer insulating layer.

21 Claims, 15 Drawing Sheets

$C-H=\frac{C}{2}$ $C-H=\frac{C}{2}$ $C-H=\frac{C}{2}$ $C-H=\frac{C}{2}$

METHOD FOR FORMING SEMICONDUCTOR DEVICE HAVING HIGH-DENSITY CONTACTS

This application relies for priority upon Korean Patent Application No. 2001-005975, filed on Feb. 7, 2001, the contents of which are herein incorporated by reference in their entirety.

BACKGROUND OF THE INVENTION

1. Field of the Invention

The present invention generally relates to the field of semiconductor devices. More particularly, the invention is directed to a method of forming a semiconductor device having high-density contacts.

2. Description of the Related Art

To manufacture high-density semiconductor devices, multi-layer interconnections have been utilized and the formation density of contacts has been increased. Thus, it is necessary to further scale down the devices and to reduce the width of contact plugs and contact-to-contact spacing from their old levels. Contact resistance, however, can increase while reducing the contact plug width. Also, contact-to-contact isolation can be difficult to achieve while reducing the contact-to-contact spacing.

With the resolution of the current exposing apparatus, the semiconductor industry has encountered many problems in contact formation especially due to a reduction in the contact width and the spacing between contacts. For example, adjacent patterns can be attached to each other because of light diffraction. As the width of a contact decreases, the area of photoresist exposed to light is also reduced. Further, some portions of the exposed photoresist are not entirely photo-sensed and thus undesirably partially remain even after development. It is widely known that it is difficult to form a contact having a spacing of 0.15 $\mu$m, considering the resolution limit and light wavelength of a current exposing apparatus such as a stepper.

On the other hand, since light can be irradiated horizontally or vertically for forming an interconnection line pattern, even the area under photoresist can be photosensed. Accordingly, interconnection lines can be even smaller than the minimum width of the contact.

However, despite these difficulties in forming a contact having a spacing of 0.15 $\mu$m, there have been ever increasing demands for semiconductor products having a contact width of 0.15 $\mu$m or less. In order to meet these demands, exposing apparatuses of higher resolution have been developed and technologies for reducing light wavelength have been suggested. In addition, there have been various approaches to form a very fine pattern.

One prior art approach uses thermal flow characteristics of a photoresist. In that approach, the smallest-possible photoresist pattern is initially formed to ultimately reduce the width of contact patterns. Thus, a photoresist pattern having the minimum width under the current technologies is formed. The width of the pattern is increased by heating the photoresist while the width between photoresist patterns decreases. That is, a window for a contact is formed with a wide width "A", as shown in FIG. 1. A photoresist pattern having a window is extended inwardly to reduce a window width to "C", as shown in FIG. 2. If the underlying layer is etched to form a contact using a photoresist as a mask, the size or width of a contact hole can be decreased.

This photoresist thermal flow technique is effective in the reduction of the pattern width up to a critical value or less by the normal exposure, while it is not effective to narrow the spacing between adjacent contact patterns, as can be seen in FIG. 2. If the spacing is reduced up to "C," i.e., a minimum distance (F), adjacent windows for a contact can be undesirably connected or attached to each other.

In this regard, a mask pattern is designed so that adjacent contact holes are not connected to each other by setting the minimum distance using prior experience. If the pattern-to-pattern spacing is reduced to be less than the minimum distance length, one group of adjacent contacts is formed first and the other group is formed later. However, the increase in the number of the pattern exposure also increases manufacturing costs. Worse yet, an error of alignment between pattern masks can be accumulated and this can aggravate processing defects.

FIGS. 4–7 illustrate an example of processing defects resulting from the accumulation of the alignment error between pattern masks, with a top plan view "A" and its cross-sectional view "B."

Referring to FIGS. 4A–4B, a first interlayer insulating layer 30 and an auxiliary layer 13 are sequentially stacked on a substrate 10 in which a conductive region 20 is formed. A pre-first photoresist pattern having a width "A" is formed, and is changed to a first photoresist pattern 11 in which a window of width "C" is formed through a thermal flow technique. Using the first photoresist pattern 11 as a mask, the auxiliary layer 13 is etched to form a first window 15 of width "C" thereon. In this case, the auxiliary layer 13 acts as a hard mask. An initial distance "B" becomes "B'" that is the distance between first windows represented by a solid line in the first photoresist pattern 11 after the thermal flow. Then, the first photoresist pattern 11 is removed.

Referring to FIGS. 5A–5B, a pre-second photoresist pattern is formed on the auxiliary layer 13. In the pre-second photoresist pattern, two windows of width "A" are formed so that the distance from the first window can be less than the minimum distance (F). Through the thermal flow, the pre-second photoresist pattern is changed to a second photoresist pattern 19 in which two second windows of width "C" are formed. Using the second photoresist pattern 19 as a mask, the auxiliary layer 13 is etched to form a second window 17 of width "C" in the auxiliary layer 13. The second photoresist pattern is then etched by conventional techniques such as ashing and stripping.

Based upon an original design to the first window 15, the second window 17 maintains the width "C" that is less than the minimum distance (F). Because of an alignment error, the second window 17 practically moves left by limit of error in the drawings. As a result, the distance between the first and second windows is reduced to "C–H(=C/2)".

Referring to FIGS. 6A–6B, using the auxiliary layer 13 with the first and second windows 15 and 17 as a mask, a first interlayer insulating layer 30 is etched to expose a conductive region 20 of the substrate 10. A conductive layer is formed on the resulting structure and is subsequently planarized until the surface of the auxiliary layer 13 is exposed, thereby forming first and second conductive plugs 21 and 23 at first and second window areas, respectively.

Referring to FIGS. 7A–7B, a second interlayer insulating layer 40 is formed on the substrate 10 in which the first and second plugs 21 and 23 are formed. The second interlayer insulating layer 40 is patterned to form a groove therein. An interconnection layer is formed thereon, and an interconnection is formed in the second interlayer insulating layer 40 by planarizing techniques such as chemical mechanical polishing (CMP). The distance between first and second interconnection pattern 45 and 44 is identical to the distance between the first and second windows 15 and 17, i.e., the distance "C (<F)". The width of the interconnection patterns 45 and 44 is "D(≧C)".

During this process, the groove is misaligned to move away from a dotted line position (original position) to a solid line position (moved position) along the direction an arrow by "H". As a result, the second contact plug 23 connected to the second interconnection pattern 44 can be undesirably connected to the fist interconnection pattern 45. This results in a fatal semiconductor device failure. Also, an overlap area of the second contact plug 23 and the second interconnection pattern 44 is too small to form the proper interconnection therebetween.

Accordingly, there is a need to address this and other limitations in the prior art.

SUMMARY OF THE INVENTION

The present invention provides methods for forming semiconductor integrated circuit devices. According to one embodiment, an interlayer insulating layer and an auxiliary layer having interconnection line patterns are sequentially formed on a substrate in which a conductive region is formed. Next, a contact photoresist pattern having bar-shaped patterns is formed on the auxiliary layer. The bar-shaped patterns extend across or are substantially orthogonal to the interconnection line pattern formed in the auxiliary layer. Then, the interlayer insulating layer is etched at a contact region using the contact photoresist pattern and the auxiliary layer as an etching mask. Subsequently, the interlayer insulating layer is etched using the auxiliary layer as an etching mask to form a contact hole that extends through the interlayer insulating layer to the conductive region and to form an interconnection groove in an upper portion of the interlayer insulating layer. The contact hole and the interconnection groove are filled with a conductive layer to form contacts and interconnection lines.

According to another embodiment of the present invention, after removing the auxiliary layer, a conductive layer is stacked thereon and is planarized until a surface of the interlayer insulating layer is exposed. Alternatively, the conductive layer is stacked on the auxiliary layer without removing the auxiliary layer. Thereafter, the conductive layer and the auxiliary layer are planarized down to a surface of the interlayer insulating layer. Thus, a contact and an interconnection are formed.

A mask for interconnection and a bar-shaped mask for contact are used to perform exposure in twice. Thus, problems resulting from alignment of exposure three times can be reduced. With the present invention, because the pitch or distance between adjacent patterns becomes definite, x-axis spacing and y-axis spacing between contacts are not changed during exposure.

BRIEF DESCRIPTION OF THE DRAWINGS

The foregoing aspect and many of the attendant advantages of this invention will become more readily appreciated as the same becomes better understood by reference to the following detailed description, when taken in conjunction with the accompanying drawings, in which.

DETAILED DESCRIPTION

The present invention will now be described more fully hereinafter with reference to accompanying drawings, in which embodiments of the invention are shown.

FIRST EMBODIMENT

Figure 1:
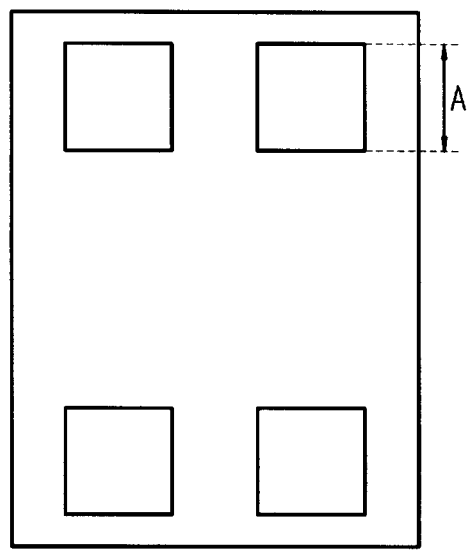
FIGS. 1–2 are exemplary views showing a photoresist flow used to reduce a pattern width in accordance with a prior art.
Figure 2:
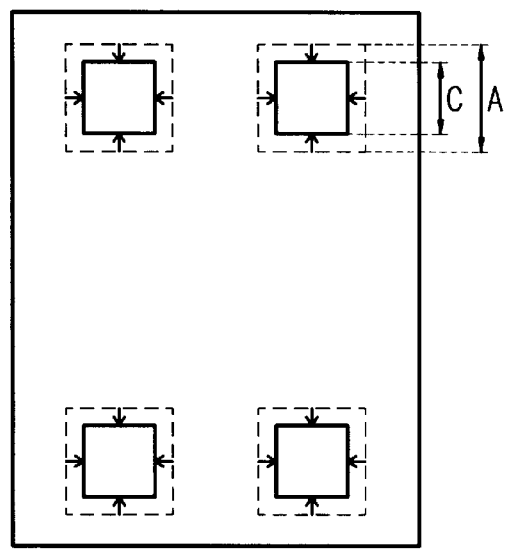
Figure 3:
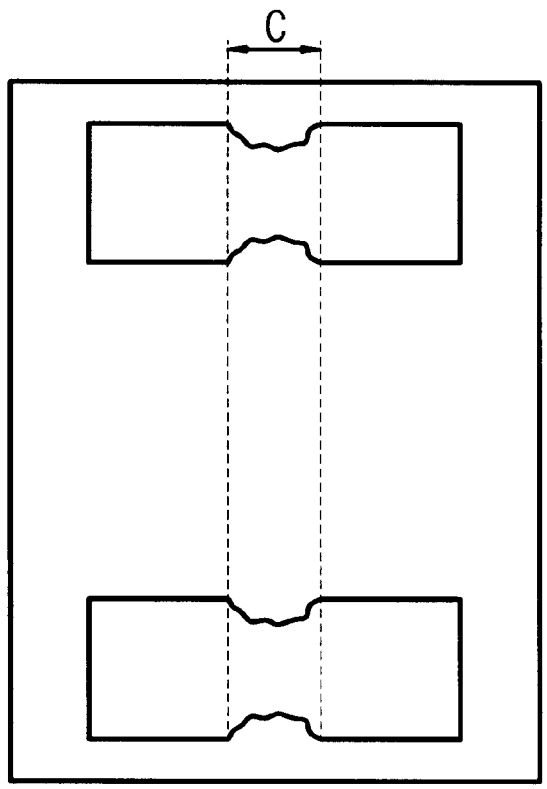
FIG. 3 is an exemplary view illustrating a problem when photoresist patterns are formed with a spacing that is narrower than a minimum distance length.
Figure 4A:
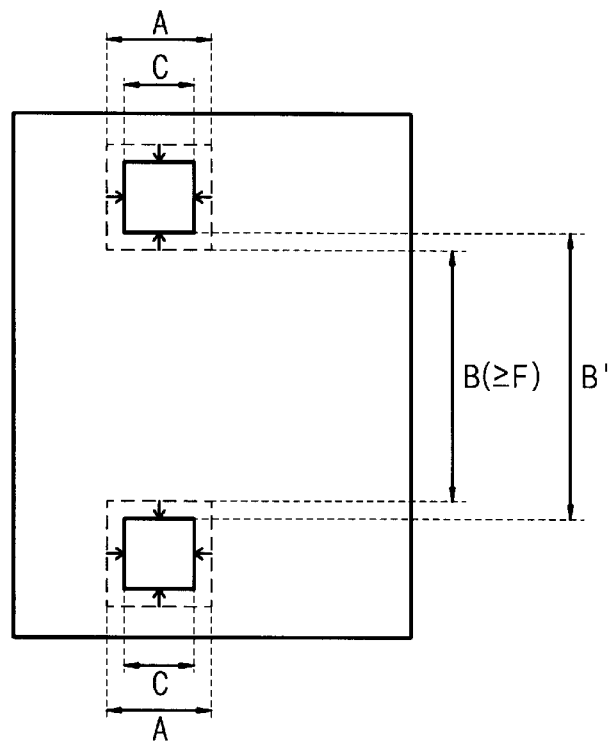
FIGS. 4A–7B are top plan views and cross-sectional views illustrating a problem when adjacent photoresist patterns are exposed in twice in order to reduce a pattern-to-pattern spacing.
Figure 4B:
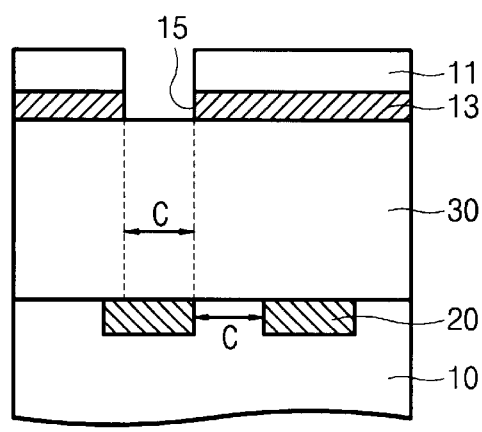
Figure 5A:
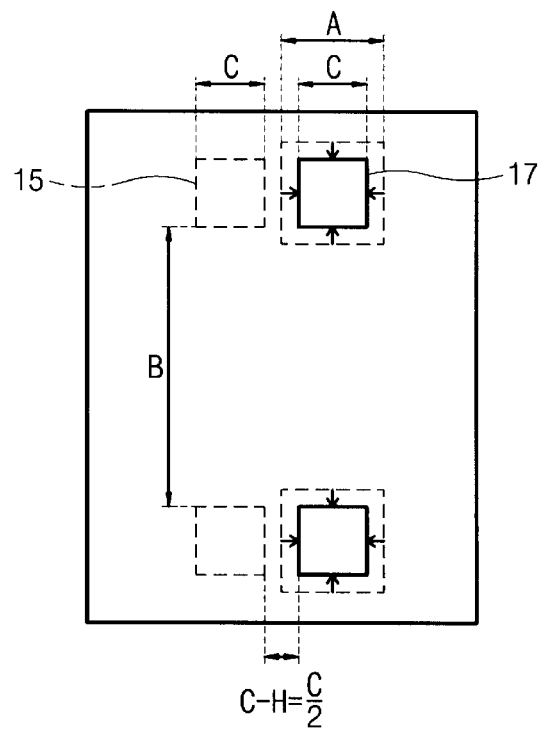
Figure 5B:
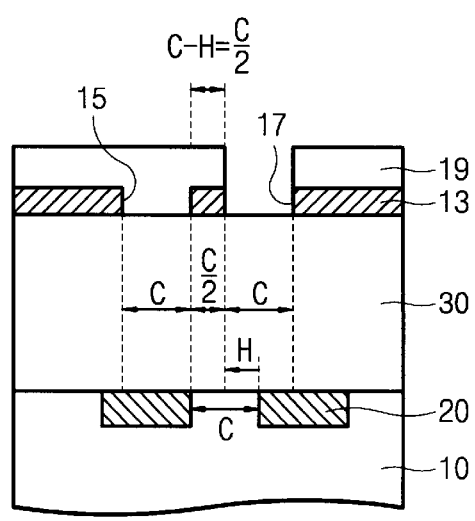
Figure 6A:
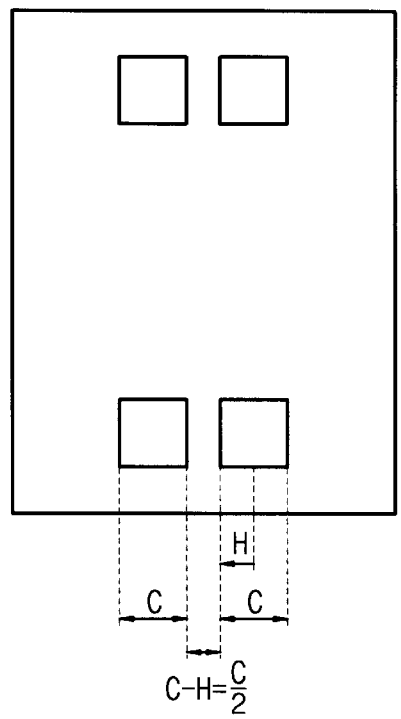
Figure 6B:
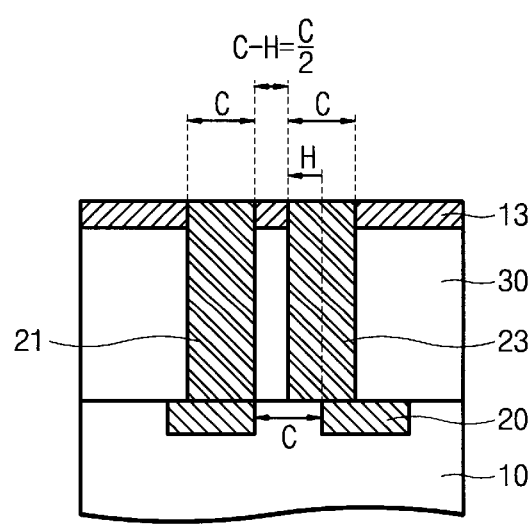
Figure 7A:
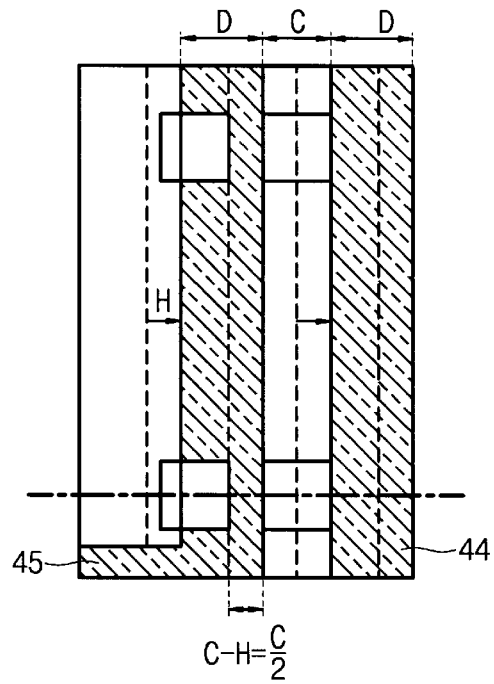
Figure 7B:
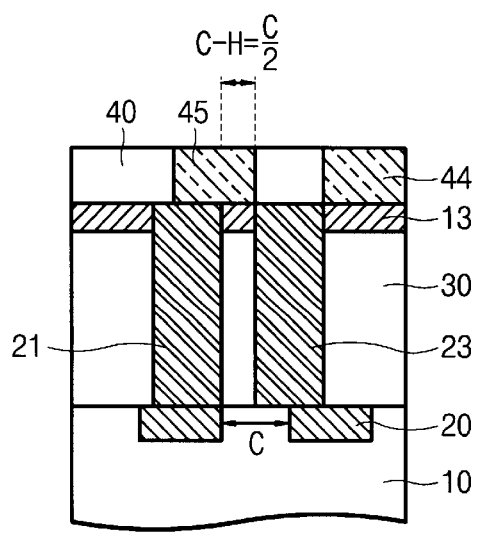
Figure 8A:
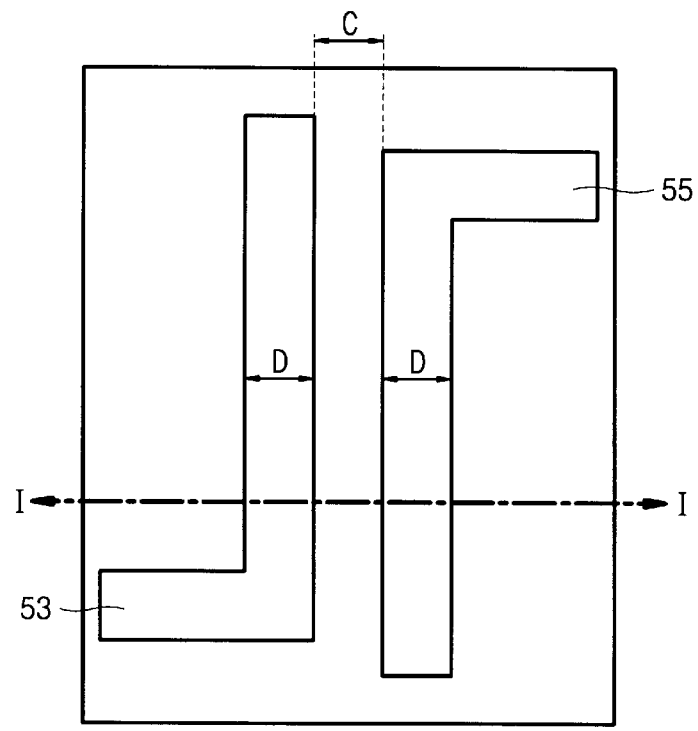
FIGS. 8A–8B are top plan view and cross-sectional view illustrating an interconnection pattern transferred to an auxiliary layer in accordance with one embodiment of the present invention.
Figure 8B:
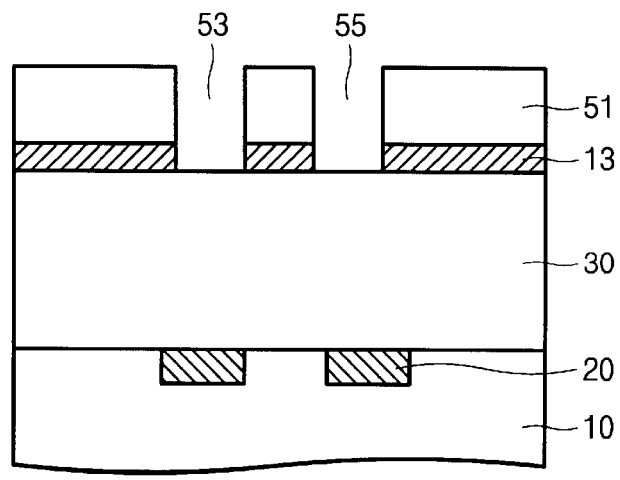

Referring now to FIGS. 8A–8B, interconnection line patterns 53 and 55 formed in a photoresist pattern 51 are transferred into an auxiliary layer 13 overlying a substrate 10. FIG. 8B is a cross-sectional view taken along a line I—I of FIG. 8A, in which "C" represents the distance between the interconnection line patterns 53 and 55, and "D" represents the width thereof. The "C" or "D" distances may be smaller than the minimum distance between contact holes with a limited definition or the minimum width of a contact hole. To form the above-described structure, a photoresist layer is placed over the substrate 10 in which an interlayer insulating layer and an auxiliary layer are sequentially stacked over a conductive region 20. Then, the photoresist layer is patterned to form a photoresist pattern 51 that defines interconnection line patterns 53, 55, using a photo mask. The interconnection line patterns 53, 55 are transferred into the auxiliary layer 13 by etching techniques, using the photoresist pattern 51 as an etching mask. The auxiliary layer 13 may includes a non-photoresist material have an etching selectivity with respect to the interlayer insulating layer such as silicon oxide. This material may be, for example, silicon nitride, polysilicon, or metallic compounds such as titanium nitride, tantalum nitride, tantalum pentaoxide, and aluminum oxide. However, a person skilled in the art will appreciate that other suitable materials not listed herein can also be used. If the auxiliary layer 13 is an insulating layer made of silicon nitride, it needs not be removed. However, the auxiliary layer 13 may not be limited to an insulating layer. If the auxiliary layer 13 is a conductive layer such as one made of polysilicon, it should be removed.

Figure 9:
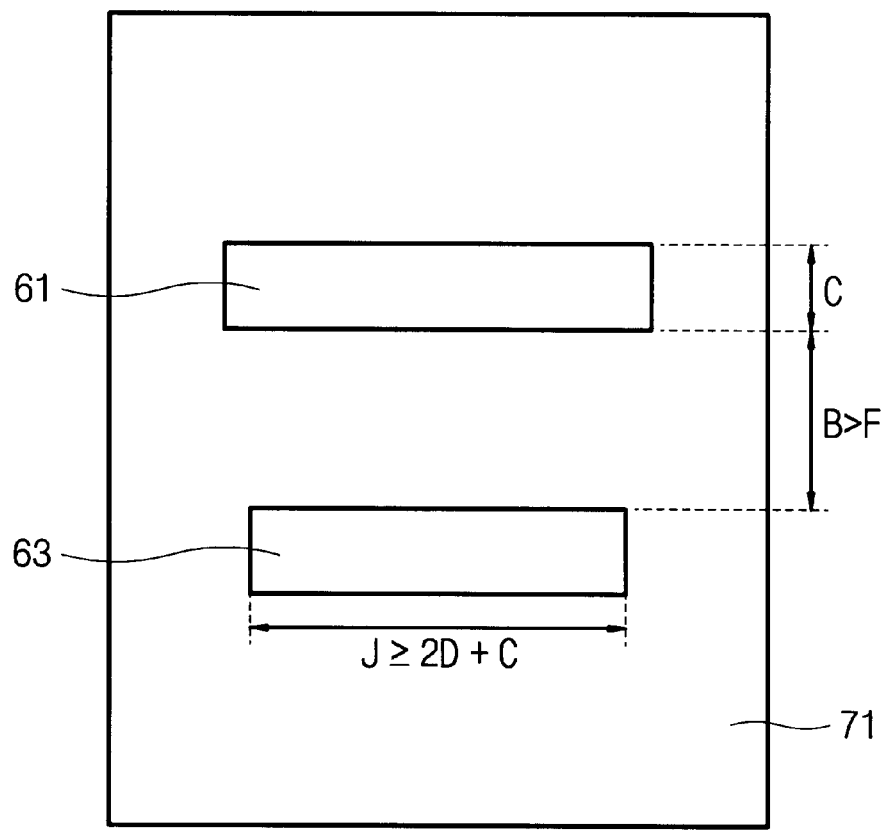
FIG. 9 is a top plan view showing bar-shaped photoresist patterns for contact in accordance with one embodiment of the present invention.
Figure 10:
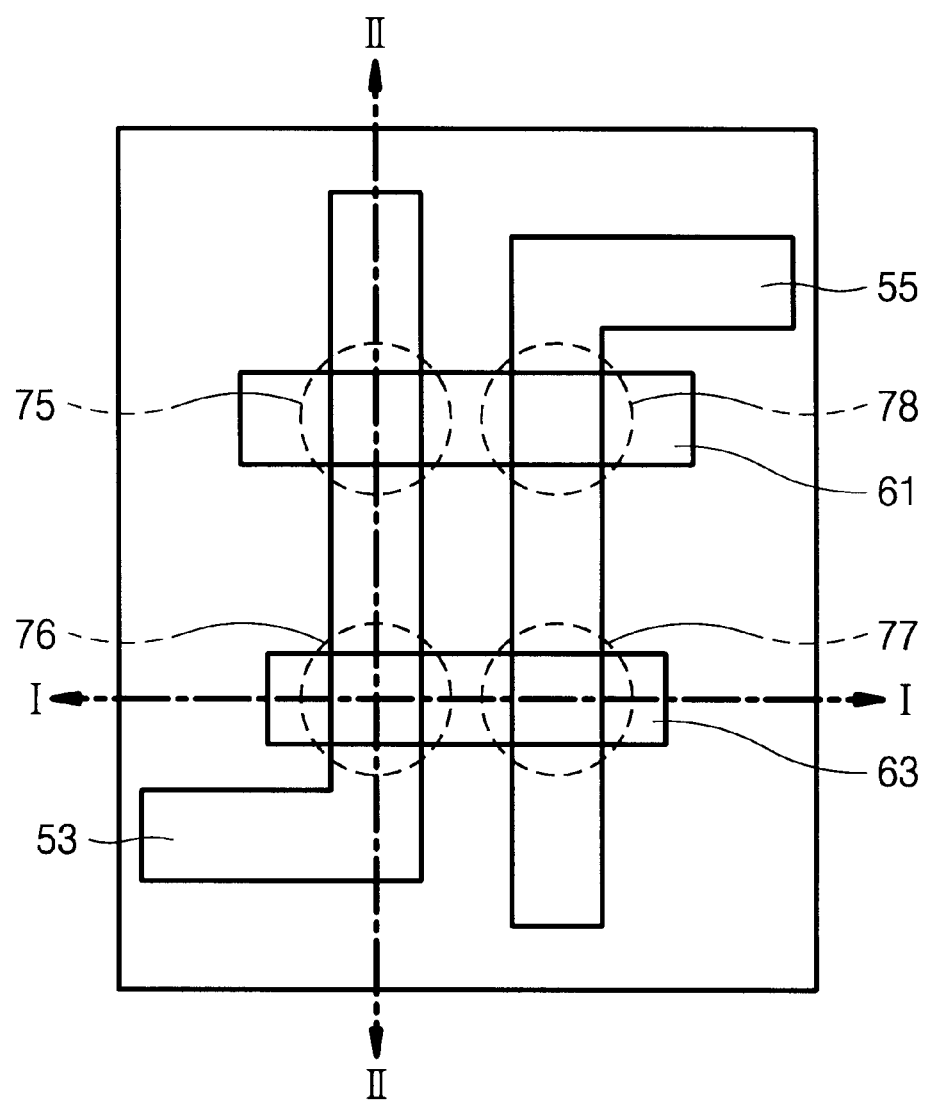
FIGS. 10–12 are top plan view and cross-sectional views showing a part of a contact hole formed by etching a pattern that is further formed.

FIG. 9 illustrates bar-shaped patterns 61, 63 formed in a photoresist pattern 71 to be used in process steps explained in conjunction with FIG. 10. The bar-shaped patterns 61, 63 are to be aligned substantially perpendicular to the interconnection line patterns 53, 55 formed in the auxiliary layer 13 to form contact holes at the intersections thereof, as illustrated in FIG. 10. Since the horizontal length is greater than the vertical length in the bar-shaped contact patterns, the horizontal width may become the width "C", which is the minimum width of the interconnection line patterns 53, 55. The distance between the bar-shaped patterns 61, 63 is the width "B", which is greater than the minimum distance (F). The lengths J of the bar-shaped patterns 61, 63 are substantially greater than the distance between two contacts to be formed, i.e., the width "C" plus the width of two interconnection line patterns "2D". Generally, if n-number of interconnection line patterns are formed with identical widths "d" and identical distances "c", then "J" may be greater than "nd+(n−1)c".

In FIG. 10, a photoresist pattern 51 is removed from the structure illustrated in FIG. 8 and another photoresist layer is again placed thereon. The photoresist layer is patterned to form a photoresist pattern 71 (FIG. 9) having bar-shaped patterns 61, 63 for contact formation, as shown in FIG. 9. A lower interlayer insulating layer 30 is etched using the bar-shaped patterns 61, 63 formed in the photoresist pattern 71 and the interconnection line patterns 53, 55 formed in the auxiliary layer 13. Consequently, contact holes 75, 76, 77, and 78 are formed at the four intersections of the interconnection line patterns 53, 55 and the bar-shaped patterns 61, 63.

Figure 11:
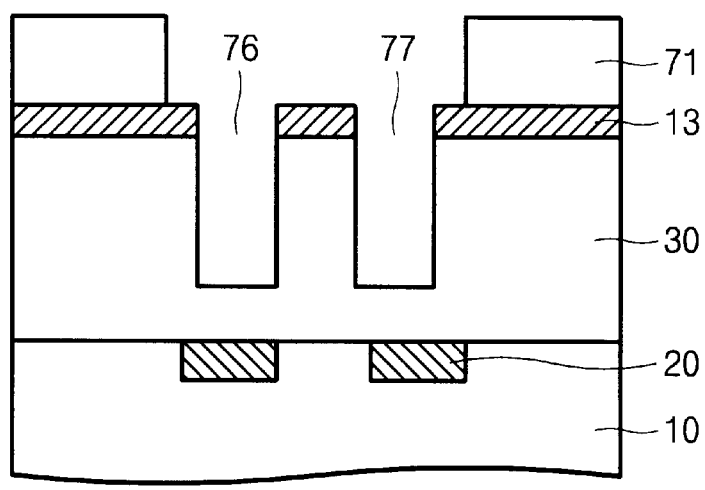
Figure 12:
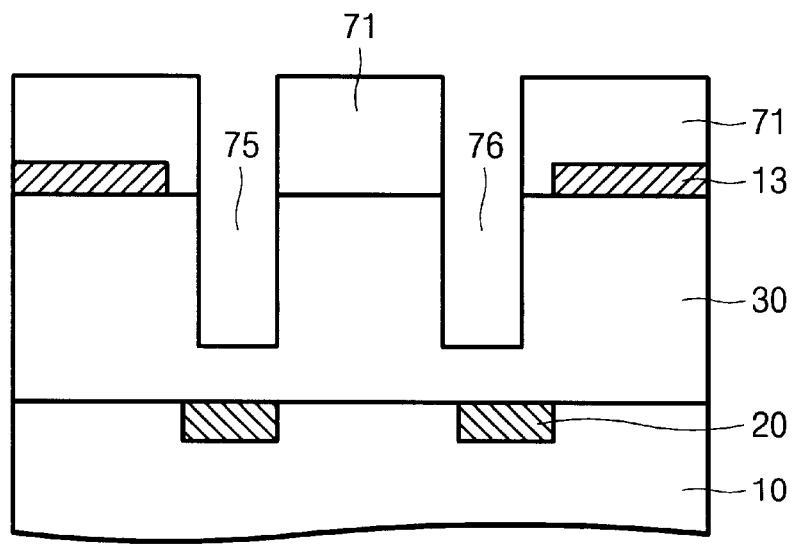

FIGS. 11–12 are cross-sectional views of a substrate, taken along lines of I—I and II—II, in the state of FIG. 10, respectively. The contact holes 75, 76, 77, and 78 may not expose the conductive region 20 of the substrate 10 in that a portion of the interlayer insulating layer 30 remains.

Figure 13:
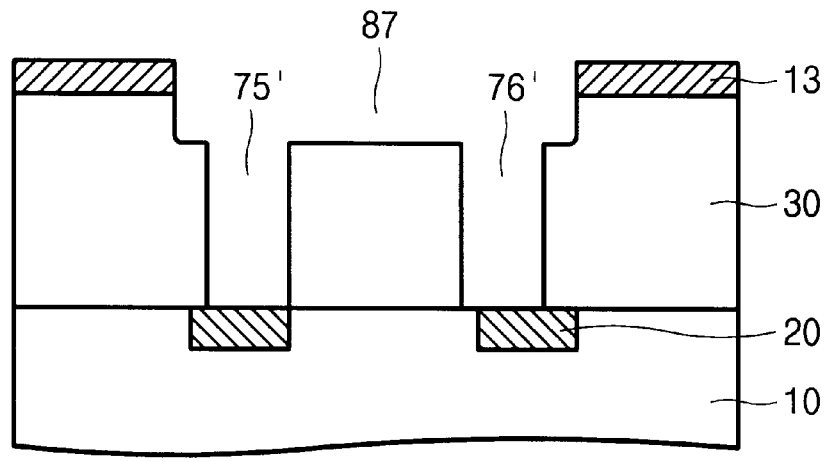
FIGS. 13–15 are cross-sectional views illustrating the post-process that is carried out in the state of FIG. 12.

In FIG. 13, the photoresist pattern 71 is removed from the structure disclosed in FIG. 12. Using the auxiliary layer 13 having the interconnection line patterns 53 and 55 as a mask, the interlayer insulating layer 30 is continuously etched to form a groove 87 overlying the interlayer insulating layer 30 and to remove the remaining interlayer insulating layer in a region of contact holes 75' and 76'. Thus, the conductive region 20 of the substrate 10 is exposed.

Figure 14:
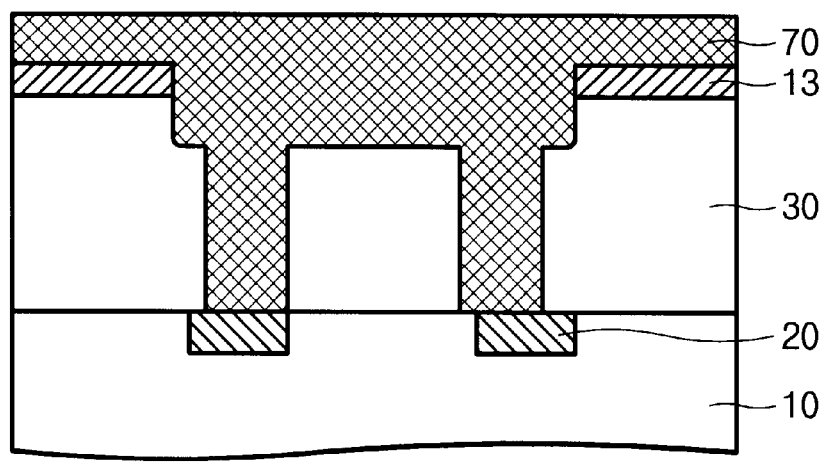

In FIG. 14, the groove 87 for interconnection and the contact holes 75' and 76' is filled with a conductive layer 70. If an aspect ratio of a contact hole is high, the conductive layer 70 may be polysilicon, tungsten, or sputtered aluminum.

Figure 15:
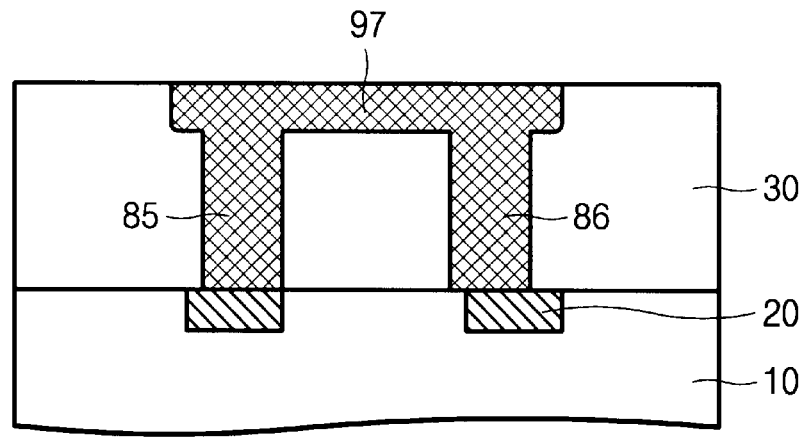

In FIG. 15, the resulting structure of FIG. 14 is subject to a planarization process until the interlayer insulating layer 30 is exposed. Thus, an interconnection 97 and contacts 85 and 86 are formed.

SECOND EMBODIMENT

A second embodiment is substantially identical to that of the first embodiment except that during etching of a contact hole with interconnection line patterns and bar-shaped patterns being intersected with each other, an interlayer insulating layer is completely removed to expose a conductive region in a substrate, in contrast with the first embodiment where there may be an interlayer insulating layer remaining.

Figure 16:
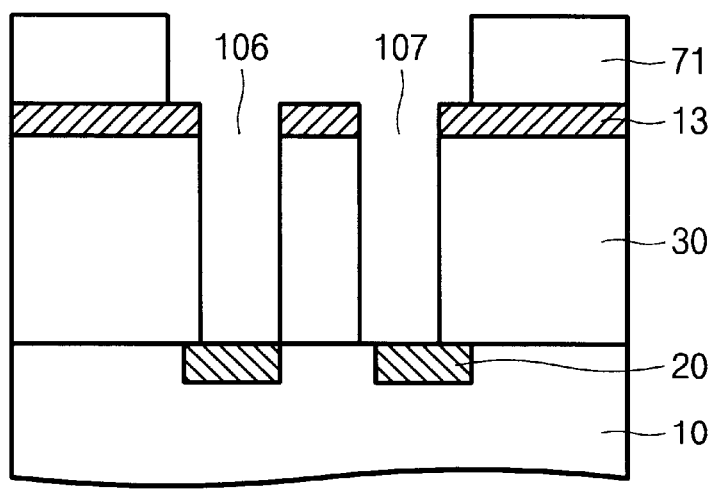
FIGS. 16–17 are cross-sectional views corresponding to FIGS. 11–12 in accordance with another embodiment of the present invention.
Figure 17:
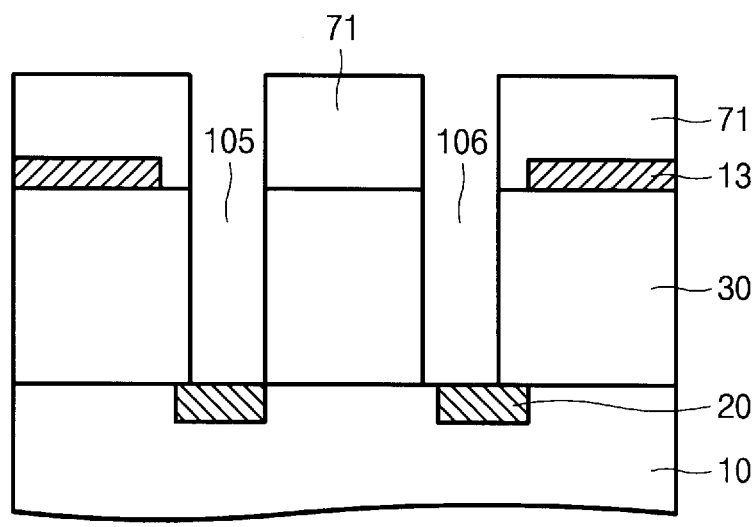

FIGS. 16–17 are cross-sectional views of the substrate, taken along lines I—I and II—II, in the state of FIG. 10, respectively. Contact holes 106, 107, and 105 expose a conductive region 20 of the substrate 10.

The remaining process steps are similar or identical to those of the first embodiment. However, an etching selectivity of an interlayer insulating layer with respect to the substrate 10 including a conductive region 20 must be sufficient. If the etching selectivity is not sufficient, the conductive region 20 exposed at a contact region may be damaged. Thus, electrical characteristics of the semiconductor device can deteriorate while forming an interconnection groove. Preferably, a gas for etching the interlayer insulating layer includes a gas mixture including CO, Ar and either of $CF_4$, $C_4F_8$, or $C_5F_8$.

THIRD EMBODIMENT

Most processes of the third embodiment are similar or identical to those of the first embodiment. In the third embodiment, a conductive layer 20' may be a conductive pattern such as a gate pattern formed on a substrate, while, in the first and second embodiments, a conductive region 20 may be a source/drain region of a silicon substrate.

Figure 18:
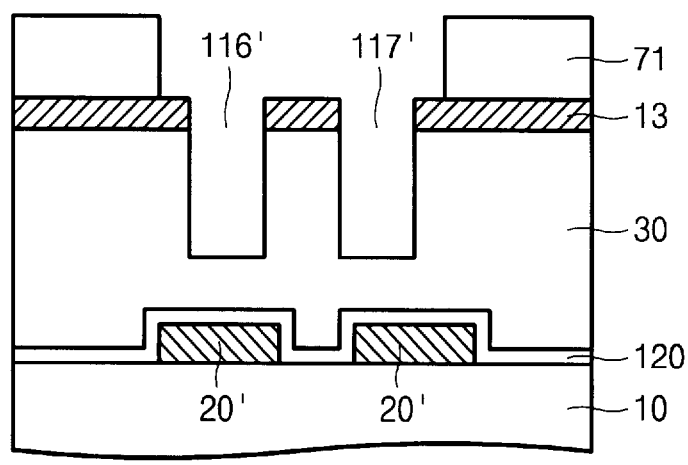
FIGS. 18–19 are cross-sectional views corresponding to FIGS. 11–12 in accordance with still another embodiment of the present invention.
Figure 19:
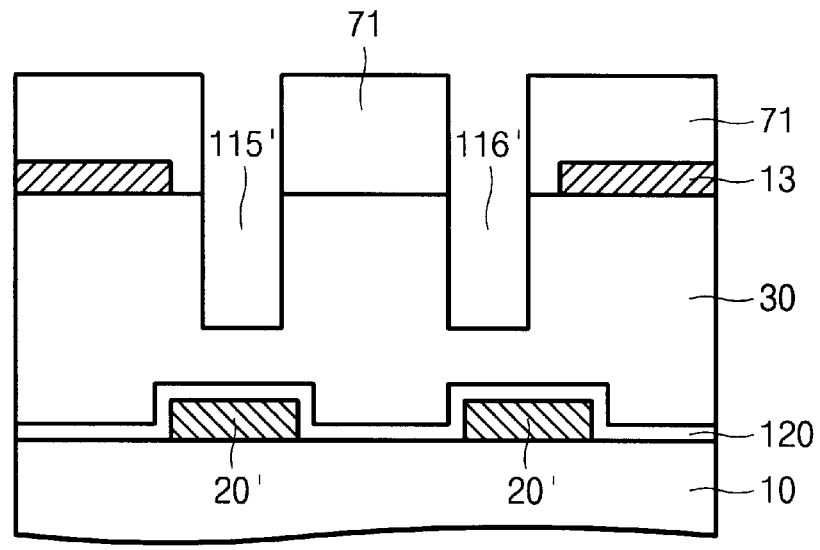

Referring to FIGS. 18–19 corresponding to FIGS. 11–12 related with the first embodiment, an etch-stop layer 120 is formed on the conductive region 20'. An interlayer insulating layer 30 and an auxiliary layer 13 are sequentially formed on the etch-stop layer 120. As in the same manner disclosed in FIG. 8A, the auxiliary layer 13 is etched to form interconnection line patterns therein on the interlayer insulating layer 30. Then, a photoresist pattern 71 is formed thereon. Using the interconnection line patterns formed in the auxiliary layer 13 and the bar-shaped patterns formed in the photoresist pattern 71 as a mask, the interlayer insulating layer 30 is etched to form partial contact holes 115', 116', and 117'.

Figure 20:
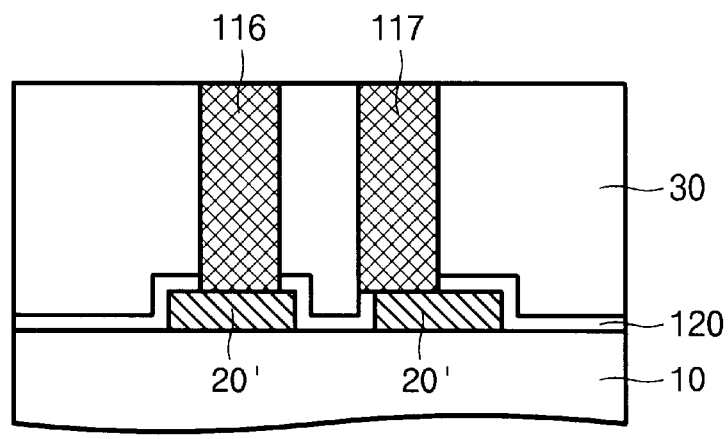
FIGS. 20–21 are cross-sectional views illustrating the post-process of FIGS. 18–19.
Figure 21:
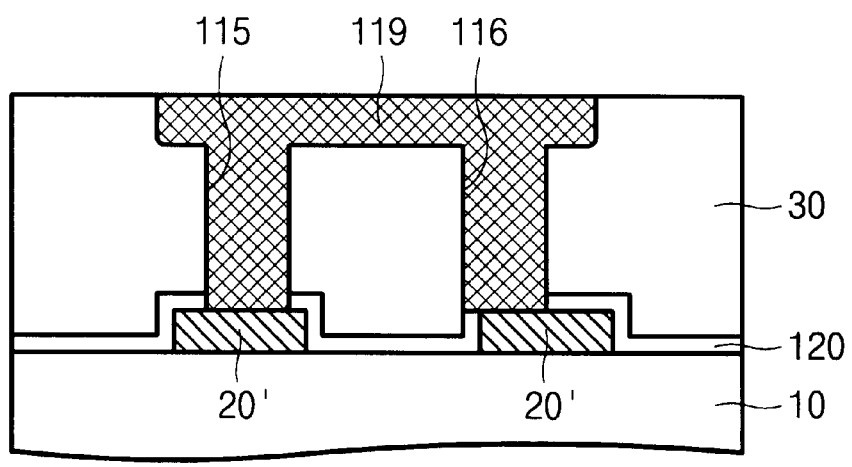

In FIGS. 20–21, the photoresist pattern 71 is removed using conventional techniques such as ashing and stripping. Using interconnection line patterns formed in the auxiliary layer 13 as a mask, the interlayer insulating layer 30 is further etched to form interconnection grooves. At the same time, contact holes 115, 116, and 117 are completed to expose an etch-stop layer 120 therethrough. The etch-stop layer 120 is then etched to expose a conductive region 20'. A conductive layer is formed thereon to fill the interconnection grooves and the contact holes 115, 116, and 117. The resulting structure is planarized to form a contact and interconnection lines 119 that are contacted with the conductive region 20' using techniques such as CMP.

In the third embodiment, a conductive region is formed over a substrate to a predetermined thickness and is protected by an etch-stop layer. Therefore, even when a contact hole is formed misaligned, the substrate can be protected during etching of contact holes and interconnection grooves, preventing device failures. The etch-stop layer may comprise a dielectric layer such as a silicon nitride layer similar to the auxiliary layer.

As described above, an auxiliary layer is used to form high-density, small contacts. Because the auxiliary layer can be removed later, a wide variety of materials forming the auxiliary layer can be used. Thus, a parasitic capacitance caused by using a material of a high dielectric constant can be reduced.

As is understood by a person skilled in the art, the foregoing preferred embodiments of the present invention are illustrated of the invention rather than limiting of the invention. It is intended to cover various modifications and similar arrangements included within the spirit and scope of the appended claims, the scope of which should be accorded the broadest interpretation so as to encompass all such modifications and similar structure.

What is claimed is:

1. A method for forming a semiconductor device, comprising:

forming an interlayer insulating layer on a substrate in which a conductive region is formed, forming an auxiliary layer on the interlayer insulating layer, the auxiliary layer having an etching selectivity with respect to the interlayer insulating layer;

forming an interconnection photoresist pattern on the auxiliary layer, the interconnection photoresist pattern defining an interconnection line pattern;

etching the auxiliary layer using the interconnection photoresist pattern as a mask to form the interconnection line pattern in the auxiliary layer;

forming a contact photoresist pattern on the auxiliary layer, the contact photoresist pattern having a bar-shaped pattern formed therein, the bar-shaped pattern substantially orthogonal to the interconnection pattern formed in the auxiliary layer;

etching the interlayer insulating layer at a contact region using the contact photoresist pattern and the auxiliary layer having the interconnection line pattern therein as an etching mask to remove a portion of the interlayer insulating layer;

etching the interlayer insulating layer using the auxiliary layer having the interconnection line pattern as an etching mask to form a contact hole that extends through the interlayer insulating layer to the conductive region and to form an interconnection groove in an upper portion of the interlayer insulating layer; and filling the contact hole and the interconnection groove with a conductive layer.

2. The method of claim 1, wherein the auxiliary layer comprises a non-photoresist material having an etching selectivity with respect to silicon oxide.

3. The method of claim 2, wherein the auxiliary layer comprises silicon nitride, polysilicon, or a metallic compound.

4. The method of claim 3, wherein the metallic compound comprises titanium nitride, tantalum nitride, tantalum oxide, or aluminum oxide.

5. The method of claim 1, wherein, during the etching of the interlayer insulating layer at a contact region using the contact photoresist pattern and the auxiliary layer as an etching mask to remove a portion of the interlayer insulating layer, a portion of the interlayer insulating layer remains over the contact region.

6. The method of claim 1, further comprising planarizing the conductive material until a surface of the interlayer insulating layer is exposed to form an interconnection and a contact.

7. The method of claim 6, wherein the planarizing comprises employing a chemical mechanical polishing (CMP) technique.

8. The method of claim 1, wherein the interlayer insulating layer comprises silicon nitride.

9. The method of claim 1, wherein an etchant used for etching the interlayer insulating layer is a gas mixture of CO, Ar and either of $CF_4$, $C_4F_8$, or $C_5F_8$.

10. The method of claim 1, wherein if "n" represents the number of interconnection line patterns crossed by the bar-shaped pattern and "d" represents a width of the interconnection pattern and "c" represents a distance between the interconnection line patterns, a length of the bar-shaped pattern is greater than "nd+(n−1)c".

11. A method for forming a semiconductor device, comprising:

forming a conductive pattern on a substrate;

forming an etch-stop layer on the conductive pattern;

forming an interlayer insulating layer on the etch-stop layer;

forming an auxiliary layer on the interlayer insulating layer, the interlayer insulating layer having an etching selectivity with respect to the auxiliary layer;

forming an interconnection photoresist pattern on the auxiliary layer, the interconnection photoresist pattern having an interconnection line pattern;

etching the auxiliary layer using the interconnection photoresist pattern as a mask to form an interconnection line pattern in the auxiliary layer;

forming a contact photoresist pattern having a bar-shaped pattern that extends across the interconnection line pattern formed in the auxiliary layer;

etching the interlayer insulating layer at a contact region using the contact photoresist pattern and the auxiliary layer having the interconnection line pattern as an etching mask to remove a portion of the interlayer insulating layer;

etching the interlayer insulating layer using the auxiliary layer having the interconnection line pattern as an etching mask to form an interconnection groove and to form a first contact hole that exposes the etch-stop layer overlying the conductive region;

etching a portion of the etch-stop layer that is adjacent to the first contact hole to form a second contact hole that exposes the conductive region; and filling the second contact hole and the groove with a conductive layer.

12. The method of claim 11, further comprising planarizing the conductive layer until a surface of the interlayer insulating layer is exposed to form an interconnection and a contact.

13. The method of claim 12, wherein the planarizing comprises chemical mechanical polishing (CMP).

14. The method of claim 11, wherein the interlayer insulating layer comprises silicon nitride, and the auxiliary layer comprises one selected from the group consisting of silicon nitride, polysilicon, titanium nitride, tantalum nitride, pentaoxide tantalum, and aluminum oxide.

15. The method of claim 11, wherein an etchant used for etching the interlayer insulating layer is a gas mixture of CO, Ar and either of $CF_4$, $C_4F_8$, or $C_5F_8$.

16. The method of claim 11, wherein a length of the bar-shaped pattern is greater than the number of interconnection line patterns crossed by the bar-shaped pattern multiplied by the width of one of the interconnection patterns added to one less than the number of interconnection line patterns multiplied by a distance between the interconnection patterns.

17. A method for forming a semiconductor device, comprising:

sequentially forming an interlayer insulating layer and an auxiliary layer on a substrate in which a conductive region is formed, the interlayer insulating layer having an etching selectivity with respect to the auxiliary layer;

forming an interconnection photoresist pattern on the auxiliary layer, the interconnection photoresist pattern defining an interconnection line pattern;

etching the auxiliary layer using the interconnection photoresist pattern as a mask to form the interconnection line pattern in the auxiliary layer;

forming a contact photoresist pattern having a bar-shaped pattern, the bar-shaped pattern perpendicular to the interconnection line pattern formed in the auxiliary layer;

etching the interlayer insulating layer at a contact region using the contact photoresist pattern for contact and the auxiliary layer having the interconnection line pattern as an etching mask to form a contact hole that extends through the interlayer insulating layer and to expose the conductive region;

etching the interlayer insulating layer using the auxiliary layer having the interconnection line pattern as an etching mask to form an interconnection groove in an upper portion of the interlayer insulating layer; and filling the contact hole and the interconnection groove with a conductive layer.

18. The method of claim 17, wherein the auxiliary layer comprises a non-photoresist material having an etch selectivity with respect to silicon oxide.

19. A method for forming semiconductor devices with high-density contacts, comprising:

sequentially forming an interlayer insulating layer and an auxiliary layer on a substrate in which a conductive region is formed, the auxiliary layer having interconnection line patterns formed therein;

forming a contact photoresist pattern having a bar-shaped pattern on the auxiliary layer, the bar-shaped pattern extending across the interconnection line patterns;

etching the interlayer insulating layer at a contact region using the contact photoresist pattern and the auxiliary layer, as an etching mask; and etching the interlayer insulating layer, using the auxiliary layer as an etching mask, to form a contact hole that extends through the interlayer insulating layer to the conductive region and to form an interconnection groove in an upper portion of the interlayer insulating layer.

20. The method of claim 19, further comprising:

filling the contact hole and the interconnection groove with a conductive layer; and planarizing the conductive layer until the interlayer insulating layer is exposed.

21. The method of claim 19, wherein the interlayer insulating layer comprises silicon nitride, and the auxiliary layer comprises one selected from the group consisting of silicon nitride, polysilicon, titanium nitride, tantalum nitride, pentaoxide tantalum, and aluminum oxide.

* * * * *

UNITED STATES PATENT AND TRADEMARK OFFICE
CERTIFICATE OF CORRECTION

PATENT NO. : 6,653,238 B1
DATED : November 25, 2003
INVENTOR(S) : Kim et al.

It is certified that error appears in the above-identified patent and that said Letters Patent is hereby corrected as shown below:

Column 3,
Line 4, "is "$D(\geqq C)$"." should read -- is "$D(\geq C)$". --.

Signed and Sealed this

Thirteenth Day of July, 2004

JON W. DUDAS
*Acting Director of the United States Patent and Trademark Office*